United States Patent [19]
Harada et al.

[11] Patent Number: 5,523,622
[45] Date of Patent: Jun. 4, 1996

[54] SEMICONDUCTOR INTEGRATED DEVICE HAVING PARALLEL SIGNAL LINES

[75] Inventors: Takashi Harada, Hidaka; Kazuhiro Yoshihara, Ohme; Kazutaka Masuzawa, Ueda; Kiyoshi Hayashi; Jun Kumazawa, both of Ohme; Kenji Nagai, Iruma; Masahiko Nishiuma, Ohme; Chiyoshi Kamada, Kokubunji, all of Japan

[73] Assignees: Hitachi, Ltd., Tokyo; Hitachi ULSI Engineering Corp., Kodaira, both of Japan

[21] Appl. No.: 533,410

[22] Filed: Sep. 25, 1995

Related U.S. Application Data

[63] Continuation of Ser. No. 153,020, Nov. 16, 1993, abandoned.

[30] Foreign Application Priority Data

Nov. 24, 1992 [JP] Japan ..................... 4-313188
Sep. 20, 1993 [JP] Japan ..................... 5-232154

[51] Int. Cl.⁶ ................................. H07L 39/02
[52] U.S. Cl. .................. 257/734; 257/738; 257/777; 257/778; 257/750; 257/698; 257/735; 257/686; 257/704
[58] Field of Search .................. 257/773, 777, 257/778, 737, 750, 664, 738, 698, 735, 734, 686, 704

[56] References Cited

U.S. PATENT DOCUMENTS

| 4,183,041 | 1/1980 | Goel | 257/737 |
| 4,710,798 | 12/1987 | Marcantonio | 257/778 |
| 4,751,482 | 6/1988 | Fukuta et al. | 257/662 |
| 5,090,609 | 2/1992 | Nakao et al. | 257/778 |
| 5,381,039 | 1/1995 | Morrison | 257/778 |

FOREIGN PATENT DOCUMENTS

| 0520841 | 12/1992 | European Pat. Off. | 257/778 |
| 1-191461 | 8/1989 | Japan . | |
| 0114683 | 5/1993 | Japan | 257/698 |
| 0061368 | 3/1994 | Japan | 257/778 |

*Primary Examiner*—Robert P. Limanek
*Assistant Examiner*—David B. Hardy
*Attorney, Agent, or Firm*—Pennie & Edmonds

[57] ABSTRACT

For taking a characteristic impedance matching of signal transmission lines in a package which carries thereon a semiconductor chip with a very high-speed LSI formed thereon, there is provided a semiconductor integrated circuit device wherein one ends of signal transmission lines formed on a main surface of a package substrate are extended up to the position just under pads formed on a main surface of the semiconductor chip and are connected to the pads on the chip electrically through bump electrodes, while opposite ends of the signal transmission lines are extended to the outer peripheral portion of the main surface of the package substrate and outer leads are bonded thereto.

7 Claims, 15 Drawing Sheets

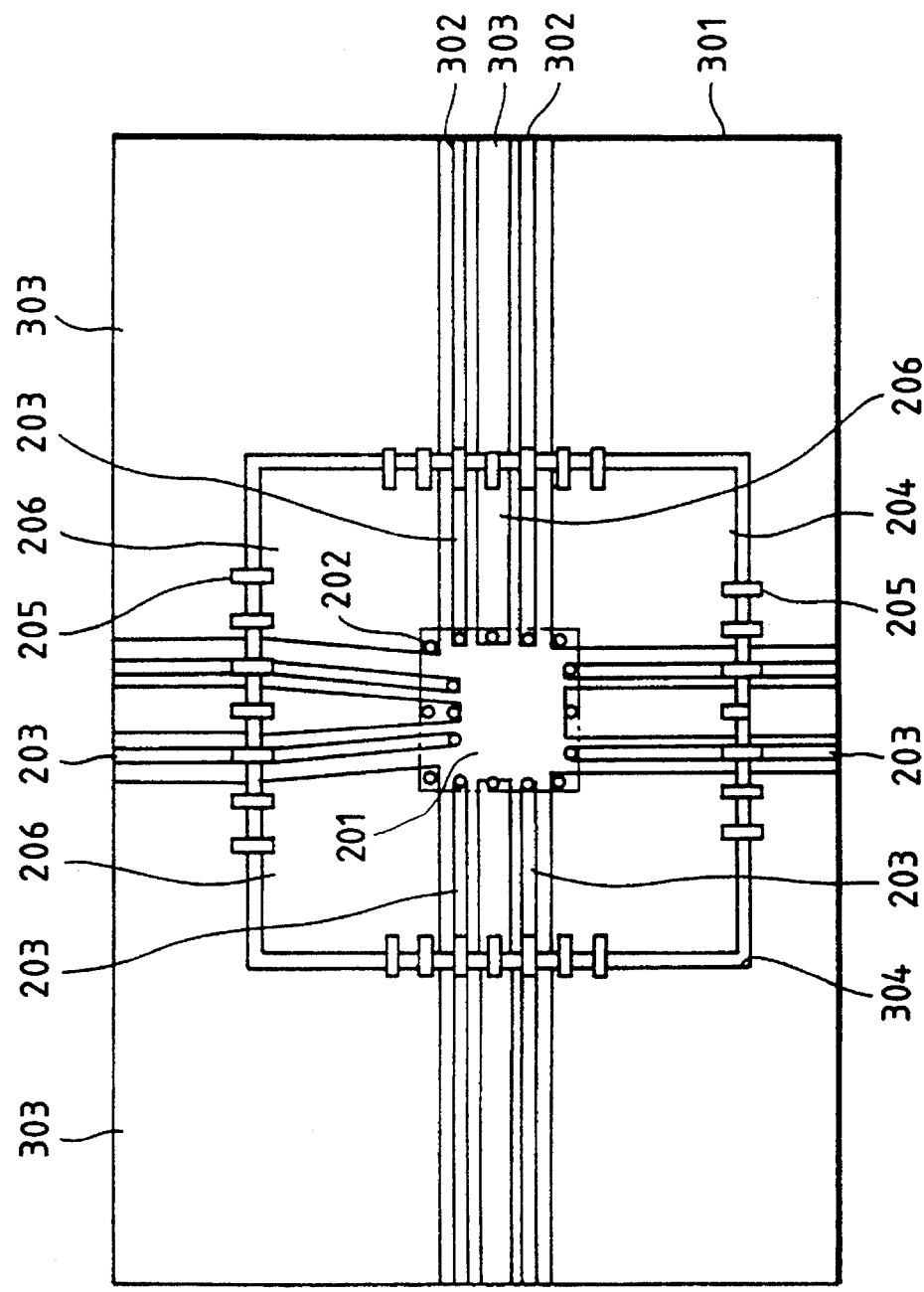

SEMICONDUCTOR INTEGRATED DEVICE HAVING PARALLEL SIGNAL LINES

This is a continuation of application Ser. No. 08/153,020, filed Nov. 16, 1993, now abandoned.

BACKGROUND OF THE INVENTION

The present invention relates to a semiconductor integrated circuit device, particularly a technique which is effective in its application to a package for mounting a very high-speed LSI thereon.

High-speed LSIs, e.g. GaAs (gallium arsenic) LSI, are used in various fields, including the transmission field, and recently the processing speed thereof has been increasing. In particular, in the high-speed digital transmission field such as optical communication, the transmission speed is much higher than 1 [Gbit/s], and even a very high-speed LSI having a transmission speed of 10 [Gbit/s] is being put to practical use.

In designing a package for mounting a semiconductor chip with such very high-speed LSI formed thereon, it is an important subject how characteristic impedance matching of signal transmission lines in the interior of the package is to be taken. This is because if there occurs mismatching of a characteristic impedance of signal transmission lines at the time of transmission of a high-frequency signal, there occurs a transmission loss such as signal reflection or waveform distortion, thus making it impossible to obtain a good transmission characteristic.

As an example of a package which has attained such characteristic impedance matching, reference is here made to U.S. Pat. No. 4,751,482.

FIG. 20 is a logical block diagram showing an example of a circuitry incorporated in a very high-speed LSI. This circuitry is a multiplexing circuitry for timewise multiplexing and outputting parallel data signals of four bits. Data signals (D) inputted from input terminals Din1–Din4 are applied to flip-flop circuits 103 through data input buffers 102. After signal synchronization in the flip-flop circuits 103, the signals are multiplexed at every two bits in 2:1 multiplexing circuits 104 each constituted by a latch circuit and a selector circuit. Further, after clock synchronization performed by a flip-flop circuit 106, the multiplexed signal is outputted through an output buffer 107.

The frequency of the clock signal applied to the circuitry through a clock input buffer 101 is divided into two by means of divider circuits 108, 108, where the frequencies of the clocks are divided in ½ and ¼, respectively. The ¼ frequency clock is outputted to the exterior through an output buffer 110 to synchronize an external circuitry which is for outputting the input data signals. Further, a reset signal (R) for resetting the internal circuitry is taken in through an input buffer 109 and there is made phase adjustment between the internal clocks generated by the divider circuits 108.

In the above multiplexing circuitry, the data output and clock input portions are running at the highest speed. Therefore, it is important to constitute such signal input/output characteristics using a system having a satisfactory impedance matching.

SUMMARY OF THE INVENTION

In the conventional very high-speed LSI packages, however, since due consideration is not given to impedance matching of the whole of signal transmission lines in the interior of a package including a semiconductor chip, such conventional packages have been unsuitable for mounting on of a very high-speed LSI whose transmission speed exceeds 10 [Gbit/s].

It is an object of the present invention to provide a very high-speed LSI package wherein the whole of signal transmission lines in the interior of the package is matched in characteristic impedance to a satisfactory extent.

The above and other objects and novel features of the present invention will become apparent from the following description and the accompanying drawings.

Of the inventions disclosed herein, typical ones will be outlined below.

According to the invention a semiconductor integrated circuit device has a semiconductor chip mounted by facedown bonding onto a main surface of a package substrate with transmission lines having predetermined characteristics formed thereon. One ends of the transmission lines are extended up to positions just under electrode pads formed on the main surface of the semiconductor chip and are connected to the electrode pads electrically through bump electrodes, while outer leads are bonded to the opposite ends of the transmission lines extended to the outer peripheral portion of the main surface of the package substrate. described in claim 1, the package substrate is constituted by insulating substrates of three layers. A first earth conductor is formed between the first insulating substrate with the transmission lines formed thereon and the second insulating substrate which underlies the first insulating substrate. A power conductor is formed between the second insulating substrate and the underlying third insulating substrate. A second earth conductor is formed on the back side of the third insulating substrate, the first and second earth conductors being electrically connected with each other through through-holes formed in the second and third insulating substrates, respectively.

The semiconductor integrated circuit device has an input circuit, an input signal terminating resistor and a capacitor formed within the semiconductor chip. The input circuit and one end of the input signal terminating resistor are coupled in parallel with respect to the electrode pads, while the opposite end of the input signal terminating resistor is connected to one end of the capacitor, while the opposite end of the capacitor is connected to an earth potential. A parallel impedance between the input signal terminating resistor and the input circuit is set to a predetermined value.

The semiconductor integrated circuit device includes a substrate having a main surface with a plurality of first conductor layers (transmission lines) formed thereon and a semiconductor chip having a main surface with a high-speed logical circuit formed thereon. The semiconductor chip has a plurality of electrode pads formed over the marginal and central areas of the main surface of the chip, the semiconductor chip being mounted on the substrate in such a manner that its main surface is opposed to the main surface of the substrate. The first conductor layers being electrically connected to the electrode pads respectively, with the leads (outer leads) being electrically bonded to one ends of the first conductor layers respectively. The opposite end of at least one of the first conductor layers extends up to a position just under the electrode pad formed in the central area out of the electrode pads formed on the semiconductor chip and is connected electrically to one of the plural electrode pads.

According to the present invention, since one ends of the transmission lines formed on the package substrate extend up to positions just under the electrode pads of the semiconductor chip and the opposite ends thereof are extended to the outer peripheral portion of the package substrate, it is possible to provide good the transmission characteristics from the outer leads through the transmission lines on the package substrate up to the electrode pads on the chip.

Since the first and second earth conductors are electrically coupled together through through-holes, it is possible to stabilize the earth potential. Moreover, Since the power conductor is held between the first and second earth conductors, the stabilization of the power potential can be attained by means of capacitances formed between the power conductor and the first, and second earth conductors.

Since the capacitor is formed within the semiconductor chip, the wiring length between the capacitor and the terminating resistor can be shortened in comparison with the case where the capacitor is provided outside the chip, so that it is possible to take a good impedance matching even in the case of a higher frequency handled by the semiconductor integrated circuit device.

BRIEF DESCRIPTION OF THE DRAWINGS

FIGS. 10(a) to (j) are partial sectional views of the semiconductor chip, showing how to fabricate a bipolar transistor, successively in the order of manufacturing steps;

FIG. 12 is a schematic plan view of a mounting substrate which carries the semiconductor integrated circuit device thereon;

DESCRIPTION OF PREFERRED EMBODIMENTS

Figure 1:
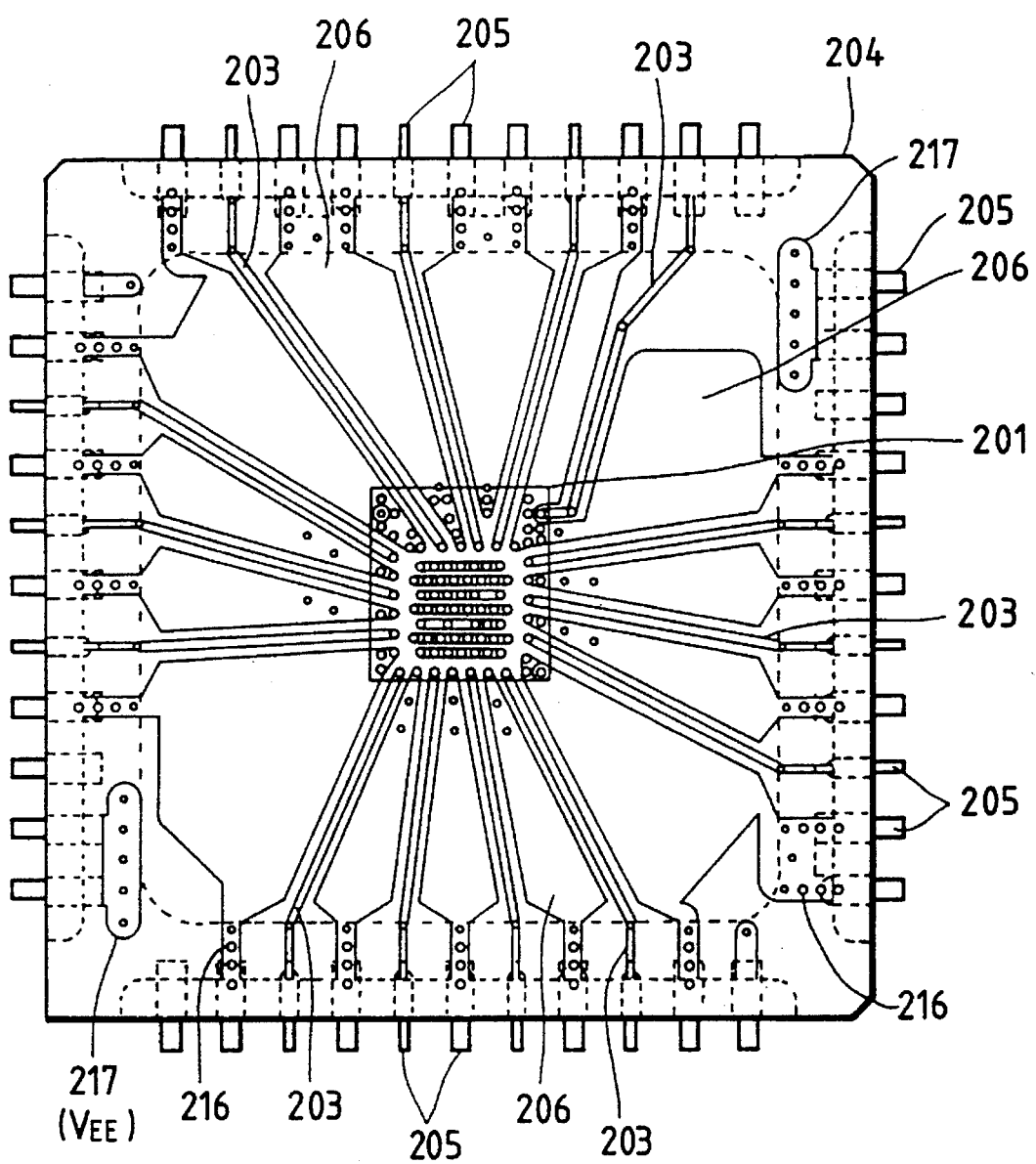
FIG. 1 is a plan view showing a configuration of a semiconductor integrated circuit device according to a first embodiment of the present invention.

The present invention will be described in detail hereinunder in terms of embodiments thereof. In all of the drawings for explanation of the embodiments, the components having the same functions are indicated by the same reference numerals to omit repeated explanations thereof.
(Embodiment 1)

Figure 3:
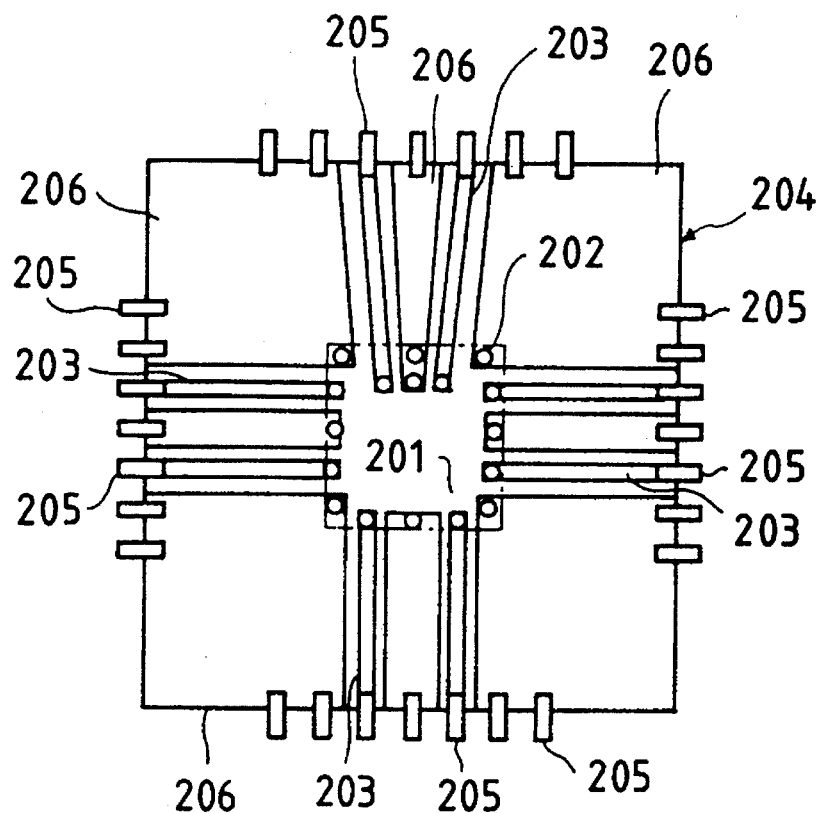
FIG. 3 is a schematic view of FIG. 1.
Figure 4:
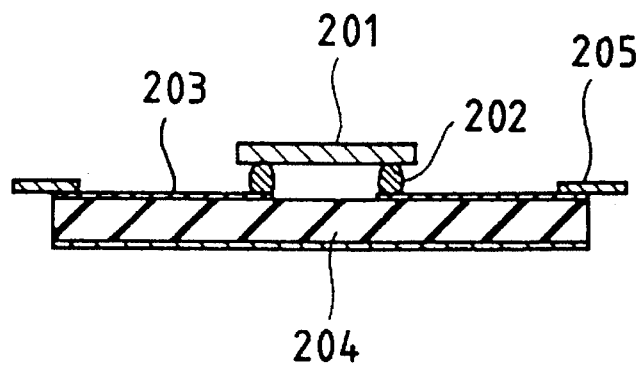
FIG. 4 is a schematic view of FIG. 2.

FIG. 3 is a schematic plan view of a semiconductor integrated circuit device according to an embodiment of the present invention and FIG. 4 is a schematic sectional view thereof.

Figure 20:
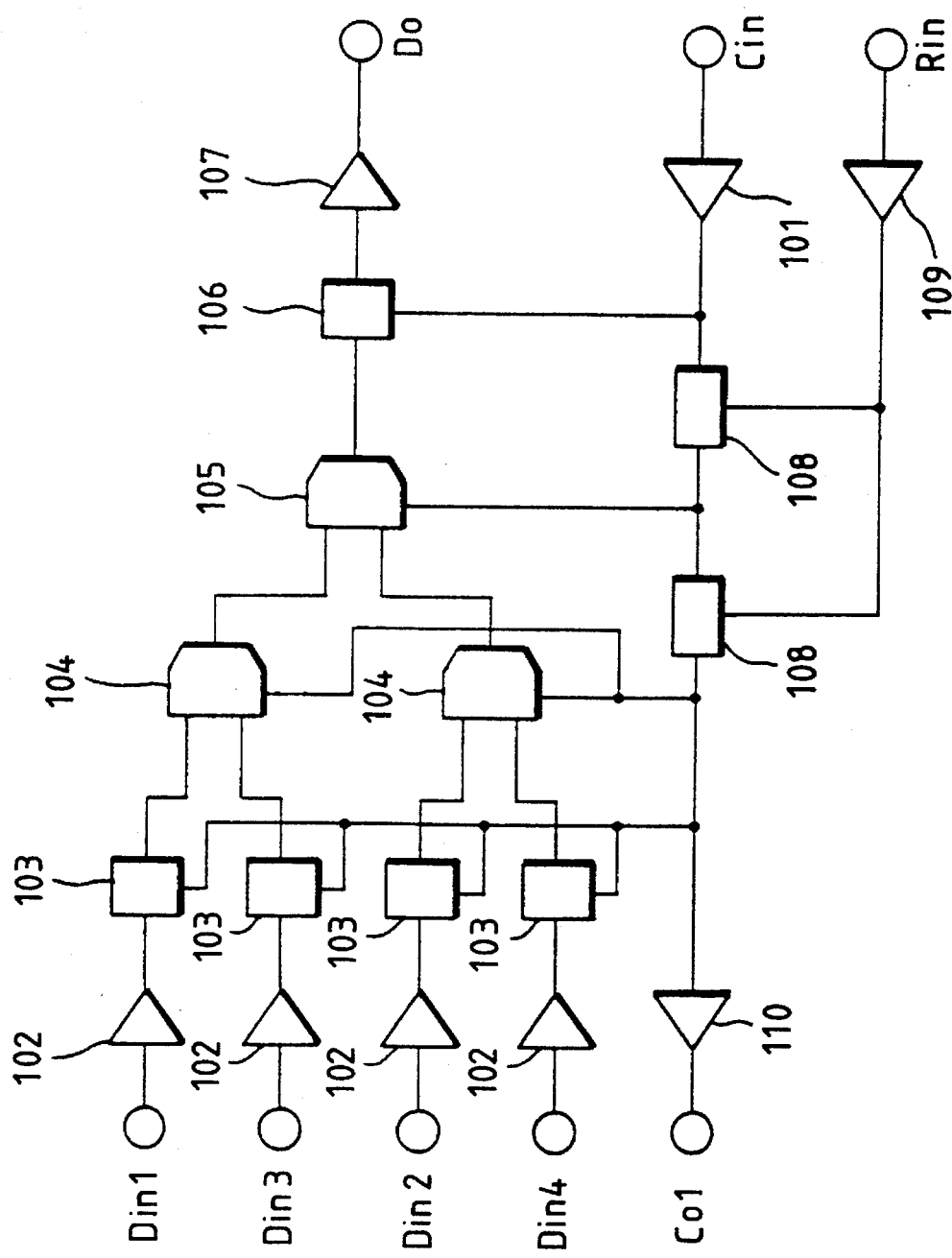
FIG. 20 is a logical block diagram showing a multiplexing circuitry.

The semiconductor integrated circuit device of this embodiment is a very high-speed LSI package in which a semiconductor chip 201 is bonded by face-down bonding to the central part of a main surface of a package substrate 204 constituted by a ceramic material such as, for example, alumina or aluminum nitride. The semiconductor chip 201 is constituted by a GaAs substrate or an SOI substrate obtained by laminating a GaAs substrate onto an insulating substrate such as sapphire. On a main surface of the chip 201 is formed a very high-speed logical LSI including a multiplexing circuitry which is shown in FIG. 20.

A plurality of signal transmission lines 203 having a predetermined transmission characteristic are formed on a main surface of the package substrate 204 radially, centered on the mounted area of the semiconductor chip 201. On both sides of adjacent signal transmission lines 203 there is formed an earth conductor 206 having a width larger than that of each transmission line 203. Thus, the package substrate 204 has a coplanar structure wherein the signal transmission lines 203 and the earth conductors 206 are arranged alternately with each other on the main surface of the substrate.

One ends of the signal transmission lines 203 and earth conductors 206 are extended up to positions just under the main surface of the semiconductor chip 201 and are connected to electrode pads (not shown) of the semiconductor chip 201 electrically through bump electrodes 202. On the other hand, the other ends of the transmission lines 203 and earth conductors 206 are extended up to the outer peripheral portion of the package substrate 204 and are electrically connected to outer leads 205 which are for connecting the LSI package to a mounting substrate as will be described later.

Figure 2:
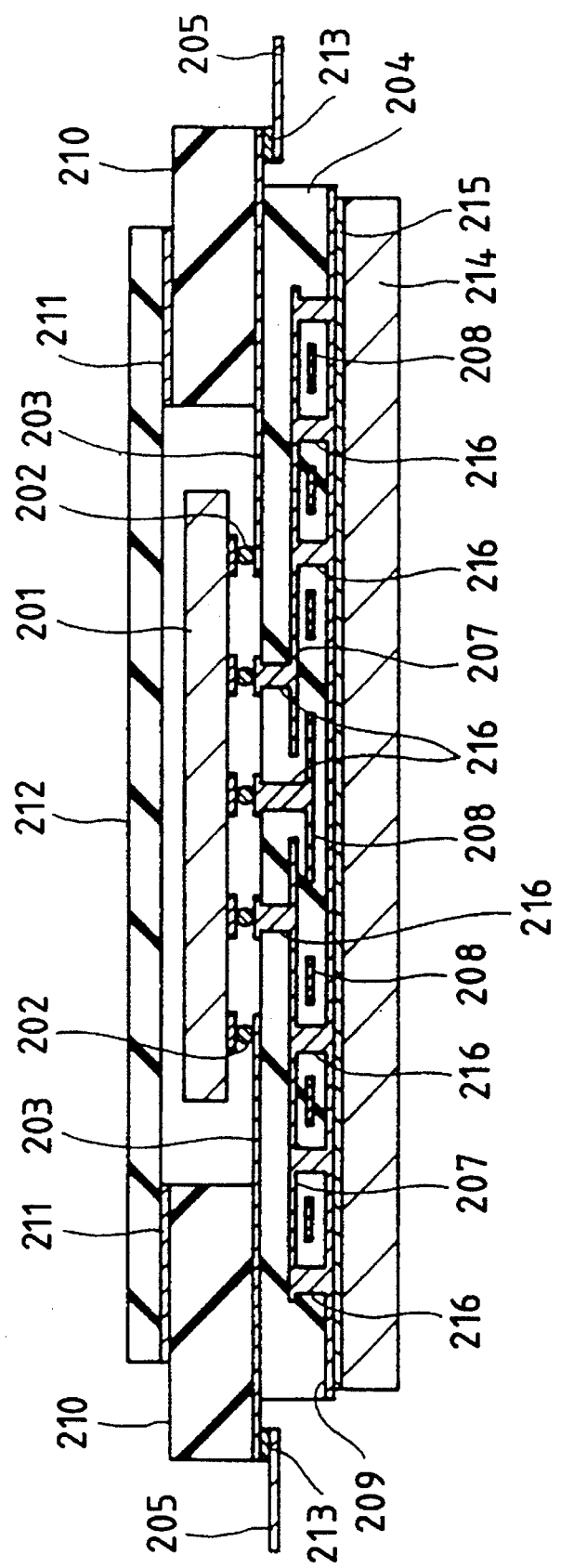
FIG. 2 is a sectional view thereof.

FIG. 1 is a plan view showing the configuration of the above LSI package in more detail and FIG. 2 is a sectional view thereof.

The package substrate 204 is composed of three ceramic layers, and a total of four conductor layers are formed, including its surface, back and inter-layer faces. The first conductor layer as the surface layer comprises the signal transmission lines 203, earth conductors 206 and power conductors 217. The second and third conductor layers comprise earth conductors 207 and power conductors 208, respectively, and the fourth conductor layer as the back layer comprises earth conductors 209.

The first to the fourth conductor layers are formed of a refractory metal, e.g. tungsten, and the surface of the first conductor layer (signal transmission lines 203, earth conductors 206 and power conductors 217) is plated with Ni and Au successively from below. The earth conductors 206 of the first conductor layer, the second conductor layer (earth conductors 207) and the fourth conductor layer (earth conductors 209) are connected with one another through through-holes 216, whereby the stabilization of the earth potential is realized.

The third conductor layer (power conductors 208) is electrically connected to the semiconductor chip 201 through the through-holes 216 and the bump electrodes 202 and also connected electrically to the outer leads 205 through the through-holes 216 and the power conductors 217 of the first conductor layer. Since the third conductor layer (power conductors 208) is sandwiched in between the second conductor layer (earth conductors 207) and the fourth conductor layer (earth conductors 209), capacitances are formed between it and the second, fourth conductor layers, whereby the power potential is stabilized.

Along the outer peripheral portion of the main surface of the package substrate 204 there is formed a dam 210 which is in the shape of a square frame. The dam 210 is constituted by the same ceramic material as that of the package substrate 204, and a cap 212 is bonded to the upper surface of the dam through a solder material 211. The cap 212 is constituted by a metallic plate of 42 alloy plated with Au for example. To the underside of the dam 210 are bonded the outer leads 205 through a solder material 213. The outer leads 205 are constituted by an Fe—Ni alloy such as 42 alloy or Kovar for example.

To the back side of the package substrate 204 is bonded a metal block 214 through a solder material 215, the metal block 214 having about the same external size as that of the said back side. The metal block 214, which is constituted by a W—Cu alloy containing 10% of Cu for example, serves to stabilize the earth potential, reinforce the package substrate 204 and also serves as a heat sink.

Figure 5:
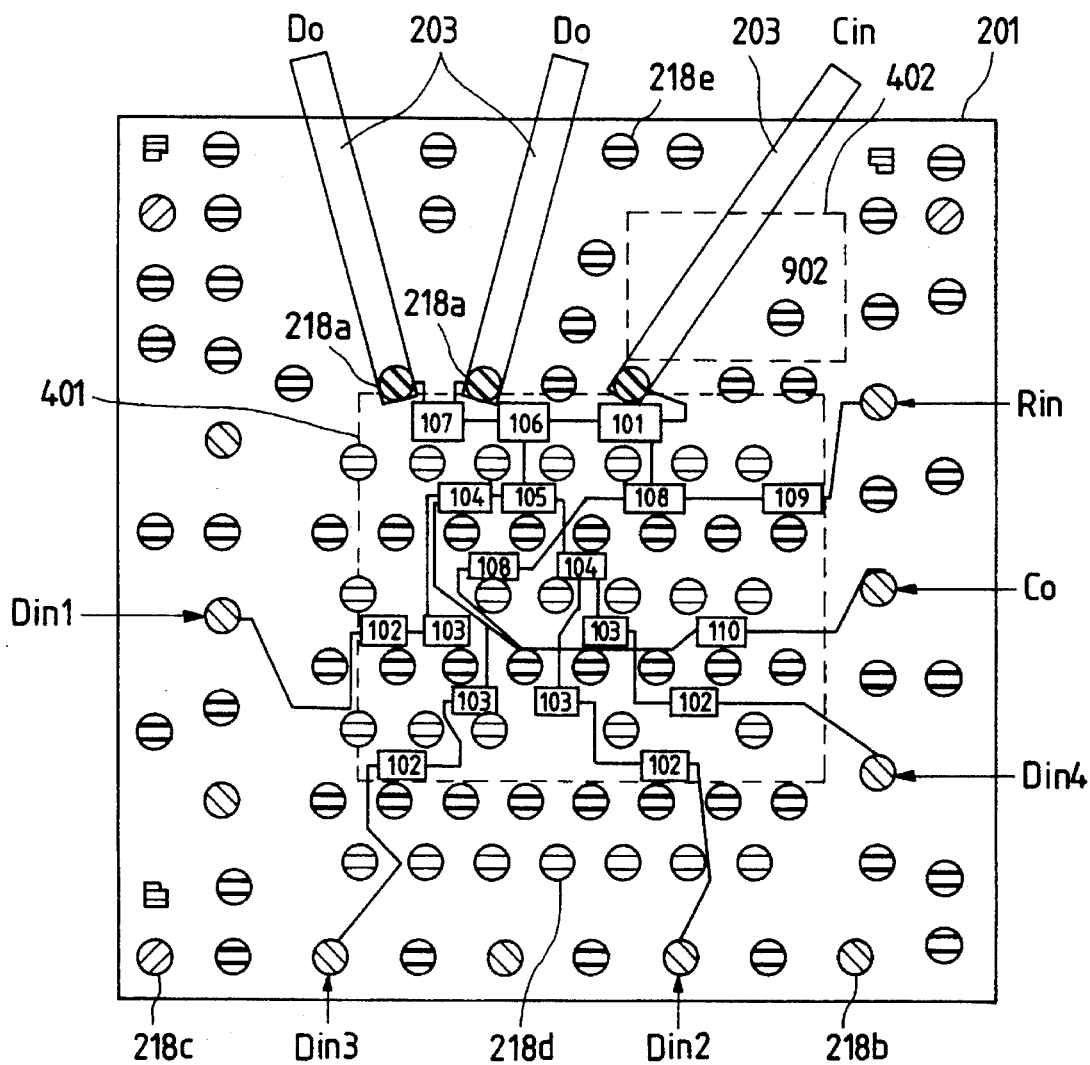
FIG. 5 is a plan view showing a chip layout of a multiplexing circuit.

FIG. 5 is a plan view showing a layout of a multiplexing circuit 401 formed on the semiconductor chip 201 of this embodiment.

Usually, in a very high-speed LSI having a transmission speed exceeding 10 [Gbit/s], it is required that portions requiring the same timing be the same in wiring length, in order to prevent shifting of the internal timing due to wiring delay variations in the chip. In actual chip design, however, there often occurs the case where it is difficult to realize the same wiring length in view of the layout of various wirings and convenience in design.

In such circumstances, shortening the wiring length itself is effective for preventing such shifting of the internal timing. Since the recent micromachining technique permits semiconductor elements such as transistors and resistors to be rendered sufficiently fine, it is fully possible to reduce the semiconductor element forming area and shorten the wiring length itself.

The chip layout shown in FIG. 5 has been made in view of the above-mentioned circumstances, in which figure the multiplexing circuit 401 is disposed centrally of the semiconductor chip 201 to shorten the wiring length. A capacitor 402 is formed outside the same circuit.

In such a layout, the chip wiring length from electrodes pads 218a–218e to the multiplexing circuit 401 becomes long, so coplanar transmission lines, for example, are formed from input-output buffers (input buffers 101, 102, 109, output buffers 107, 109) up to the pads 218a–218e. The pads 218a, 218b, 218c, 218d and 218e represent a high-frequency signal pad, a low-frequency signal pad, a DC pad, a power pad and a GND pad, respectively.

However, the width of each coplanar transmission line formed on the semiconductor chip 201 is several 10 μm or so at most and the thickness thereof encounters a limit of 1 μm or so at most in consideration of a decrease in the difference in height, resulting in that the transmission loss is increased in the high frequency region.

On the other hand, in the case of the signal transmission lines 203 formed on the package substrate 204, it is fully possible to set the width and thickness thereof to about 100–200 μm and 10–100 μm, respectively, so the transmission loss can be made small up to a negligible extent in comparison with the transmission lines formed on the semiconductor chip 201.

As shown in FIG. 5, therefore, by disposing the electrode pads 218a for input and output of signals of the highest frequency out of the input and output signals for the semiconductor chip 201, near the central part of the chip, and by extending the signal transmission lines 203 formed on the package substrate 204 up to the positions of the pads 218a, it is made possible to diminish the transmission loss of the high-frequency signals and hence it becomes possible to obtain a good transmission characteristic.

In this embodiment, though not shown, a protective film such as silicon oxide film is formed on the top wiring layer of the chip 201 and the electrode pads 218a–218e are formed thereon. In the case where the bump electrodes 202 bonded onto the electrode pads 218a–218e are constituted by Au balls, it is optimum to form at least the skin layer of each of those electrode pads using Au. It is desirable that the thickness of the Au film as the skin layer be set to at least 0.5 μm. It has been confirmed that at a film thickness of, say, 0.1 μm there occurs a defect in compression bonding of the bump electrodes 202 with a probability of about 0.1%.

In order to prevent damage or parasitic capacitance at the time of mounting, the bump electrodes 202 are disposed in the area where the components of the multiplexing circuit 401 and capacitor 402 are not formed.

Figure 6:
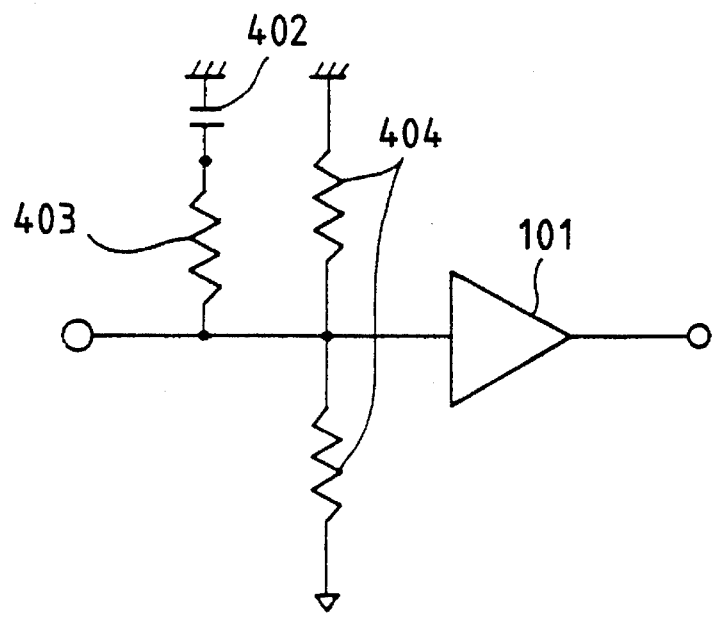
FIG. 6 is a circuit diagram of a clock input buffer and the vicinity thereof in the multiplexing circuit.

FIG. 6 is a circuit diagram in the vicinity of the clock input buffer 101 in the multiplexing circuit 401.

It is preferred that the clock signal required for the digital LSI be inputted after elimination of its DC component because the periodicity thereof is preserved. More particularly, when the clock signal is inputted together with its DC component, if the amplitude thereof changes, the amplitude center thereof deviates from a reference level which is set within the LSI, thus causing shifting of the clock duty (clock width) in the interior of the LSI. As a result, the clock timing margin is decreased in the LSI interior. On the other hand, in the case of AC coupling, the clock width is kept constant in the LSI interior because a change in clock width if any causes deflection centered on the reference level.

The reference numeral 403 in FIG. 6 denotes a terminating resistor. Ideally, its resistance value is set at the same value (usually 50 Ω) as the impedance of the outer transmission lines. The numeral 402 in the same figure denotes a capacitor for realizing AC coupling independently of the bias level of lead-out terminals. Forming the capacitor 402 and the terminating resistor 403 within the semiconductor chip 201 is important in realizing a high-frequency operation.

Heretofore, as this type of a capacitor there has been provided a chip capacitor in the exterior of the semiconductor chip 201. But with increase of the frequency handled by the semiconductor integrated circuit device the length of wire or line for coupling the capacitor and the terminating resistor becomes large to an unnegligible extent in comparison with the signal wavelength, thus resulting in that it becomes difficult to take good impedance matching.

Therefore, disposing the capacitor 402 and the terminating resistor 403 in close proximity to the clock input buffer 101 is effective for preventing the deterioration of the transmission characteristic. A resistor 404 shown in the figure is for applying a bias for the clock input buffer 101, and no special limitation is imposed on this mode.

Figure 8:
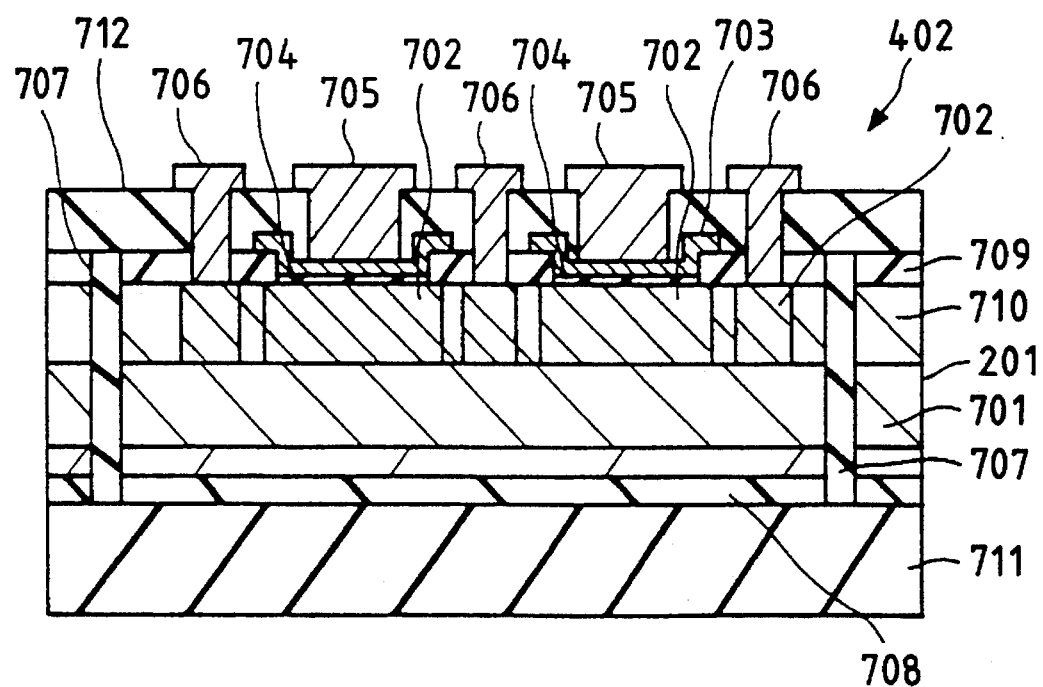
FIG. 8 is a partial sectional view of a semiconductor chip, showing a sectional structure of a capacitor.
Figure 7:
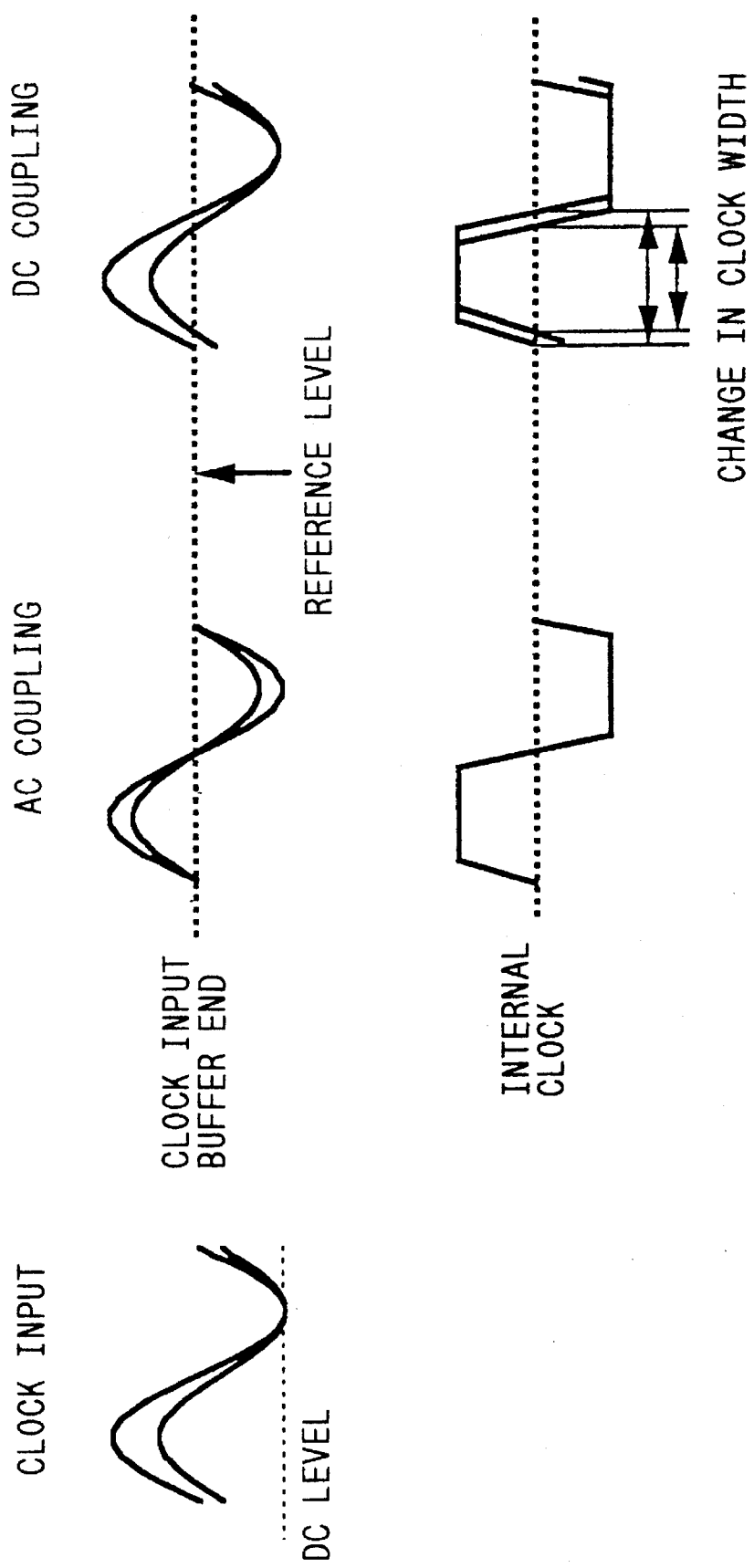
FIG. 7 is a diagram schematically showing clock signal deviations.
Figure 9A:
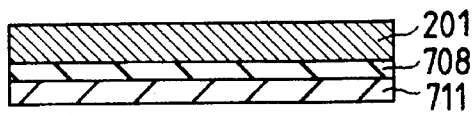
FIGS. 9(a) to (j) are partial sectional views of the semiconductor chip, showing how to fabricate the capacitor illustrated in FIG. 8, successively in the order of manufacturing steps.
Figure 9B:
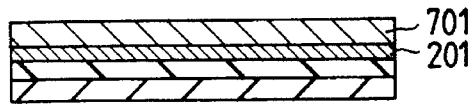
Figure 9C:
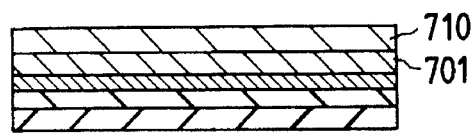
Figure 9D:
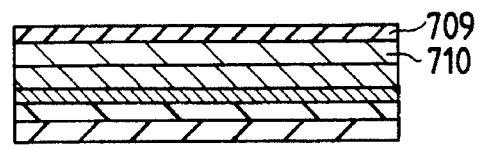
Figure 9E:
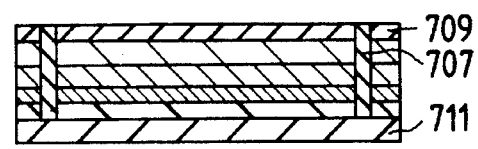
Figure 9F:
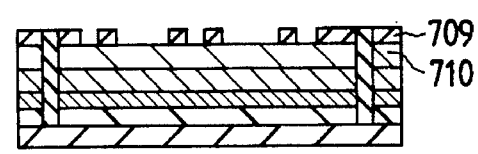
Figure 9G:
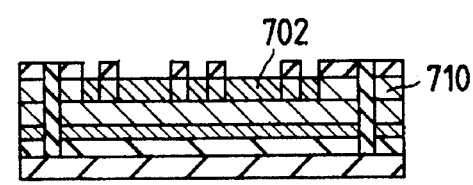
Figure 9H:
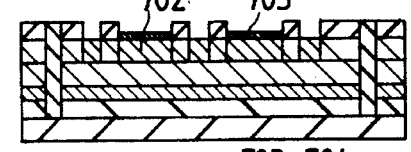
Figure 9I:
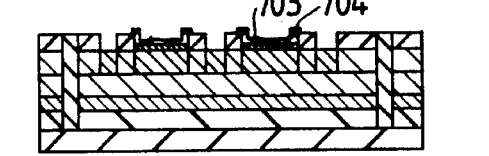
Figure 9J:
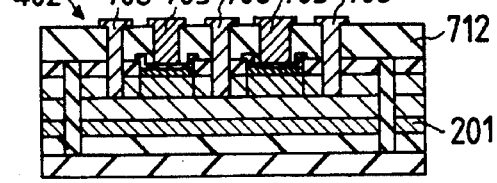
Figure 10A:
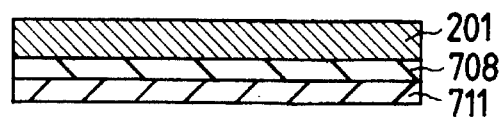
Figure 10B:
Figure 10C:
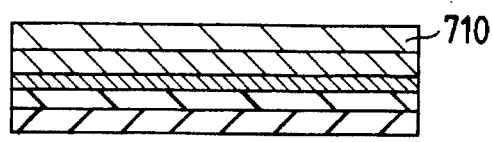
Figure 10D:
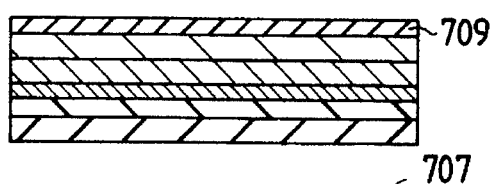
Figure 10E:
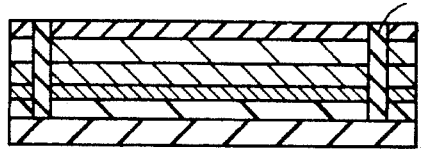
Figure 10F:
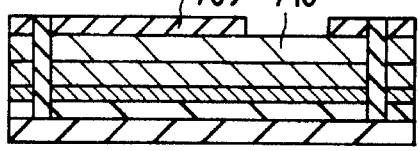
Figure 10G:
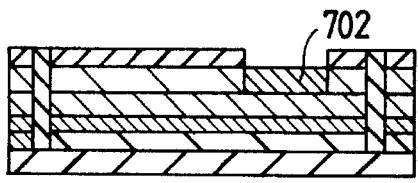
Figure 10I:
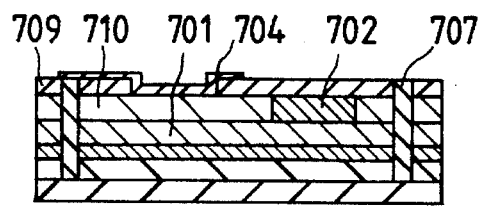
Figure 10J:
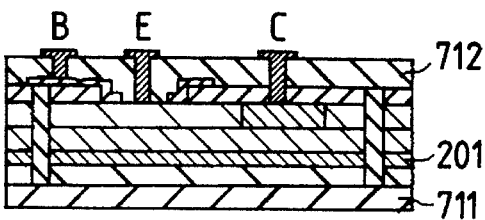

A sectional structure of the capacitor 402 is illustrated in FIG. 8. The same figure shows an example in which the capacitor 402 is formed on the semiconductor chip 201 bonded through a silicon oxide film 708 onto an insulating substrate 711 such as sapphire. In the same figure, the numeral 701 denotes an n-type burred layer of high density; numeral 702 denotes an n-type semiconductor region formed by the same process as that for the collection take-out region of an npn-type bipolar transistor; numeral 709 denotes a silicon oxide film for element isolation; and numeral 710 denotes an n-type epitaxial layer. Further, numeral 703 denotes a polycrystal silicon film which serves as a buffer layer at the time of taking out an extraction electrode 705 from above; numeral 704 denotes a thin silicon oxide film formed by thermal oxidation of a part of the n-type semiconductor region 702, which film constitutes a capacitor insulating film; and numeral 706 denotes another extraction electrode. Between the extraction electrodes 706 and 705 there is formed the capacitor 402. In the case of using the semiconductor chip 201 of such SOI structure, the capacitor 402 and the other elements can be completely separated from each other by a U-trench 707.

An example of how to fabricate the capacitor 402 will be described below with reference to FIG. 9.

First, as shown in (a) of the same figure, there is provided an SOI substrate comprising an insulating substrate 711 and a semiconductor chip 201 laminated onto the substrate 711 through a silicon oxide film 708. Next, an n-type impurity (e.g. As) is ion-implanted into a main surface of the semiconductor chip 201 to form an n-type buried layer 701 of high density.

Then, as shown in (c), an n-type epitaxial layer 710 is formed on the n-type buried layer 701, and thereafter, a silicon oxide film 709 for element isolation is formed on the epitaxial layer 710, as shown in (d). Next, as shown in (e), a U-trench 707 reaching the insulating substrate 711 is formed in part of the silicon oxide film 709, and an insulating film such as silicon oxide film is embedded into the U-trench.

Subsequently, as shown in (f), some portions of the silicon oxide film 709 are cut out to expose the corresponding portions of the epitaxial layer 710. Then, as shown in (g), an n-type impurity is ion-implanted into the epitaxial layer 710 to form an n-type semiconductor region 702. Next, as shown in (h), a buffer layer 703 constituted by a polycrystal silicon film is formed on the n-type semiconductor region 702, and thereafter, the surface of the buffer layer 703 is oxidized to form a thin silicon oxide film 704 which serves as a capacitor insulating film, as shown in (i).

Then, as shown in (j), holes are formed in some portions of a thick silicon oxide film 712 deposited on the surface of the semiconductor substrate 201, and extraction electrodes 705 are formed on the silicon oxide film 704, while extraction electrodes 706 are formed on the n-type semiconductor region 702, whereby a capacitor 402 is completed. As shown in FIG. 10, the capacitor 402 can be formed by the same process as that for forming an npn bipolar transistor except the step (h) of forming the buffer layer 703 of a polycrystal silicon film on the n-type semiconductor region 702.

The capacitor 402 can also be formed by the following process, though not shown. In accordance with the process illustrated in FIGS. 9 (a) to (e), a silicon oxide film 709 for element isolation is formed on an epitaxial layer 710, and holes are formed in some portions of the silicon oxide film 709 to form a U-trench 707. Thereafter, the whole of the silicon oxide film 709 in the capacitor forming region is once removed.

Then, an n-type impurity is ion-implanted into the epitaxial layer 710 to form an n-type semiconductor region 702, on which is again formed a silicon oxide film, followed by the same process as that explained previously in connection with FIG. 9. According to this process, since the n-type semiconductor region 702 can be formed throughout the entire capacitor forming region, it is possible to decrease the series resistance between the silicon oxide film 704 and the extraction electrode 706.

Figure 11:
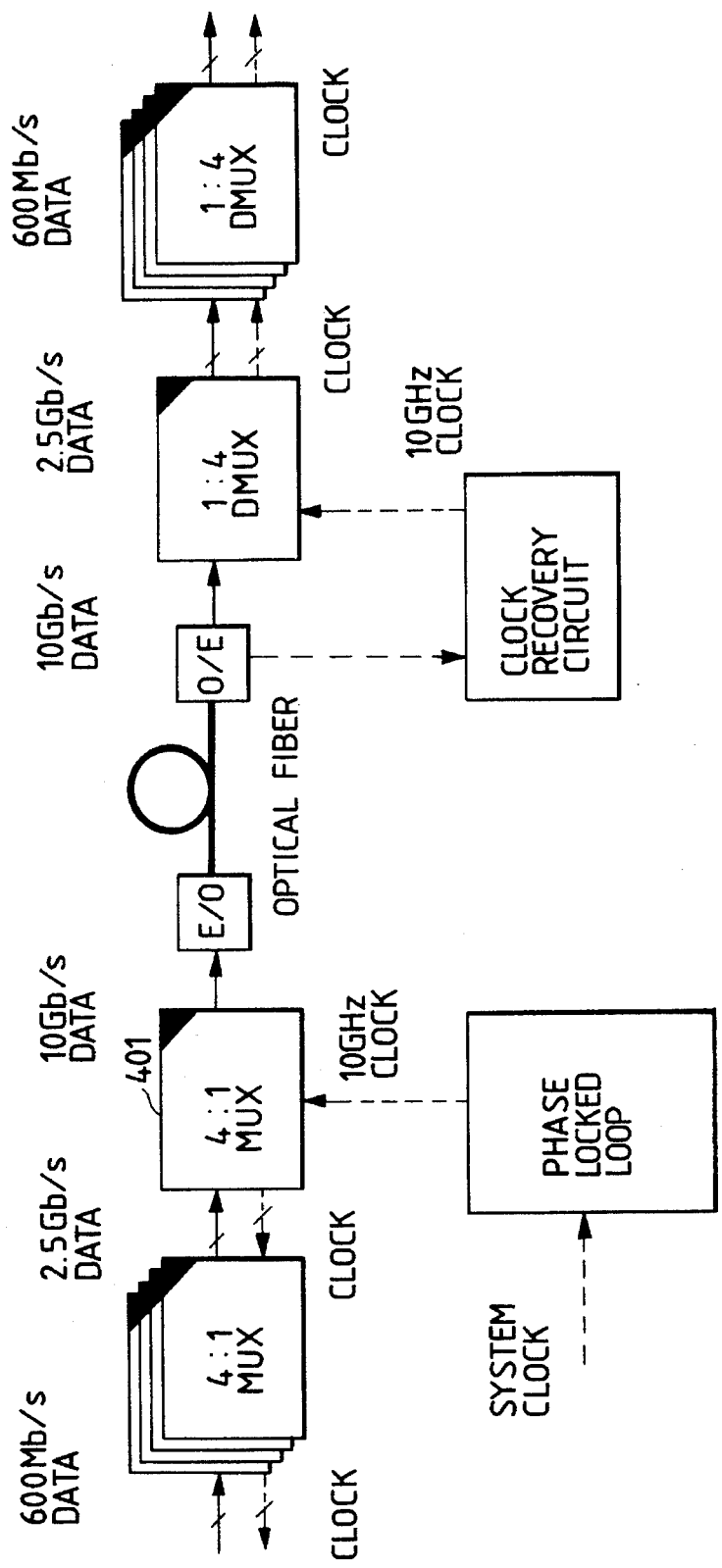
FIG. 11 is a diagram showing an example of a system configuration using the semiconductor integrated circuit device according to the first embodiment.

An example of a system configuration using a very high-speed LSI provided with the multiplexing circuit 401 is shown in FIG. 11.

Figure 13:
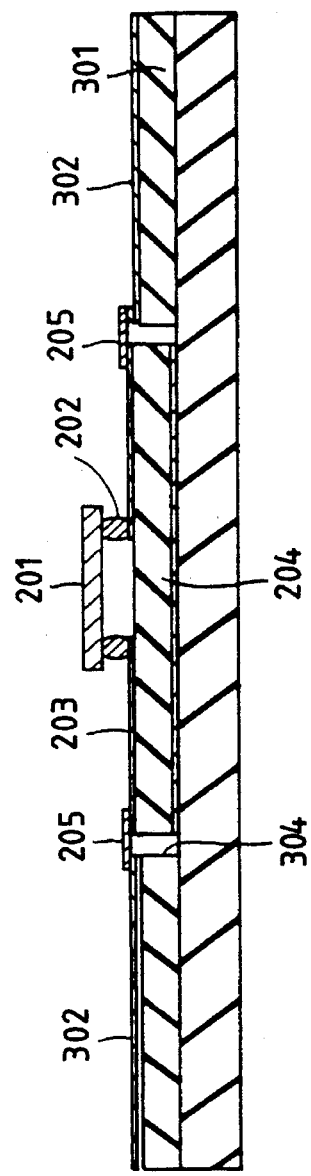
FIG. 13 is a schematic sectional view thereof.

FIG. 12 is a schematic plan view of a mounting substrate 301 which carries the very high-speed LSI package of this embodiment thereon, and FIG. 13 is a schematic sectional view thereof.

The mounting substrate 301 is constituted by the same ceramic material as that of the package substrate 204, and within a cavity 304 formed centrally of a main surface of the substrate 301 there is mounted the LSI package in such a manner that the main surface of the package substrate 204 and that of the mounting substrate 301 are substantially flush with each other.

On the main surface of the mounting substrate 301 are formed signal transmission lines 302 radially, centered on the cavity 304. On both sides of each signal transmission line 302 there are formed earth conductors 303 which are wider than the transmission line 302. The signal transmission lines 302 and the signal transmission lines 203 of the package substrate 204 are connected together electrically through outer leads 205. Further, the earth conductors 303 and the earth conductors 206 of the package substrate 204 are electrically coupled together through outer leads 205.

According to the above mounting structure, a predetermined transmission characteristic is kept good from the signal transmission lines 302 of the mounting substrate 301 through the signal transmission lines 302 of the package substrate 204 up to the semiconductor chip 201.

Figure 14:
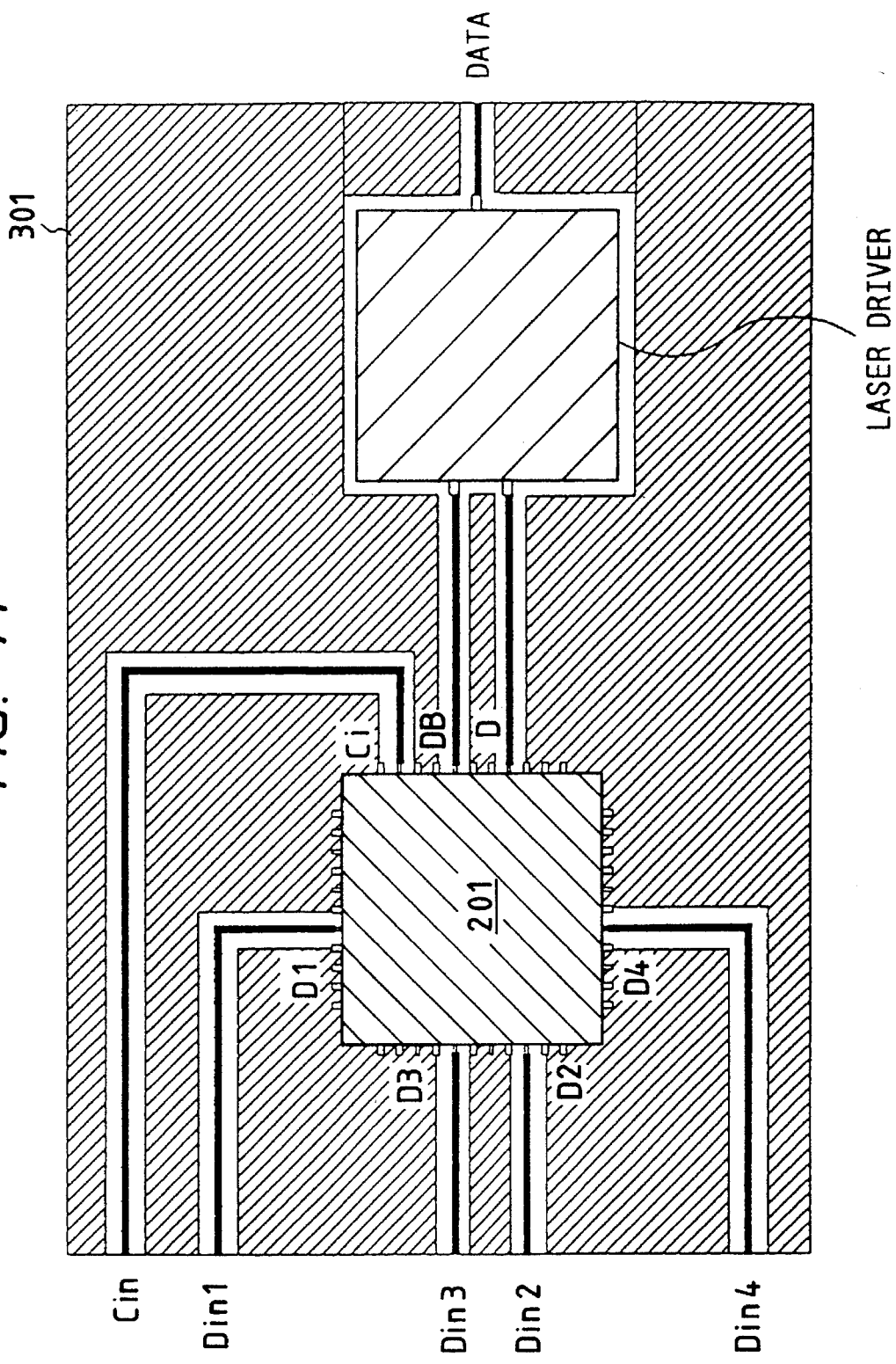
FIG. 14 is a schematic plan view of a mounting substrate which carries the semiconductor integrated circuit device thereon.

FIG. 14 shows an example in which both the very high-speed LSI described above and a package for laser driver are mounted on the main surface of the mounting substrate 301.

(Second Embodiment)

Figure 15:
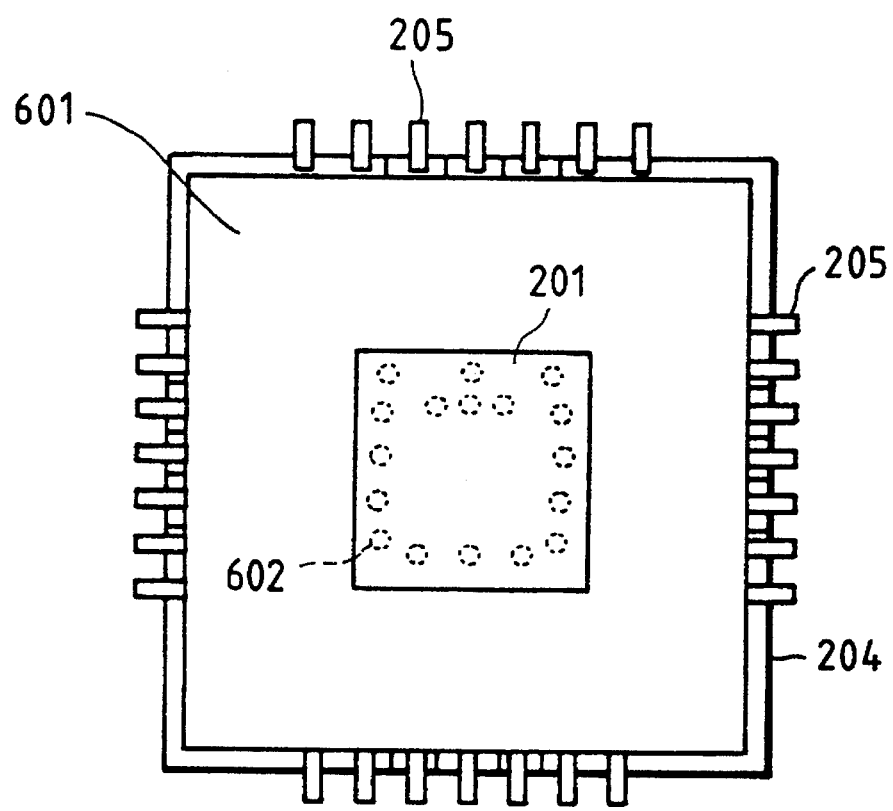
FIG. 15 is a plan view showing a configuration of a semiconductor integrated circuit device according to another embodiment of the present invention.
Figure 16:
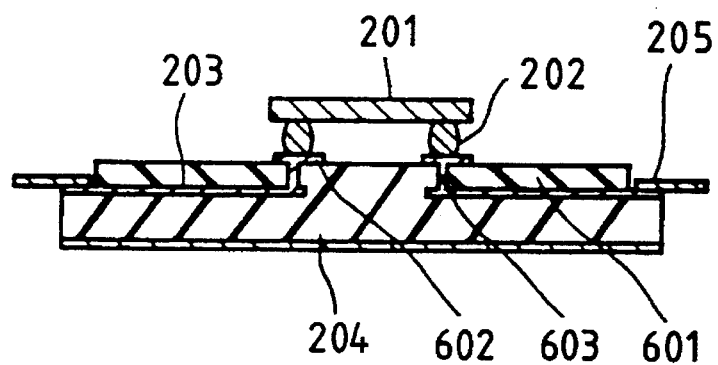
FIG. 16 is a sectional view thereof.

FIG. 15 is a schematic plan view of a semiconductor integrated circuit device according to a second embodiment of the present invention and FIG. 16 is a schematic sectional view thereof.

In the LSI package of this embodiment, bump electrodes 202 bonded onto electrode pads (not shown) on a main surface of a semiconductor chip 201 are formed using a solder (Pb—Sn alloy).

In the case where the bump electrodes 202 are formed by a solder, if signal transmission lines 203 are exposed to the surface of the package substrate 204 as in the previous embodiment, molten solder will flow out onto the signal transmission lines 203 because of reflow of the bump electrodes 202 at the time of mounting the semiconductor chip 201 onto the substrate 204, thus resulting in that a high connection reliability is no longer obtainable.

In this embodiment, an insulator layer 601 is formed on a main surface of the package substrate 204 to prevent molten solder from flowing out onto the signal transmission lines 203 at the time of reflow.

The insulator layer 601 is formed of the same ceramic material as that of the package substrate 204, and on the surface thereof is formed a generally circular conductor pattern 602 to which the bump electrodes 202 are connected. The conductor pattern 602 and the signal transmission lines 203 (and earth conductors 206 and power conductors 208 neither shown in FIGS. 15 and 16) are interconnected electrically through the through-holes 603 formed in the insulator layer 601.

Although the insulator layer 601 illustrated in the figures is formed so as to cover substantially the whole of the main surface of the package substrate 204, it may be formed to cover only the area exclusive of the portion above the signal transmission lines 203 (and the earth conductors 206 and power conductors 208), whereby it is made possible to plate the surfaces of the signal transmission lines 203 (and the earth conductors 206 and power conductors 208) with Au and hence possible to decrease the electric resistance thereof.

Although the invention accomplished by the present inventor has been described above concretely on the basis of embodiments thereof, it goes without saying that the present invention is not limited to those embodiments and that various changes and modifications may be made within the range not departing from the gist of the invention.

Figure 17A:
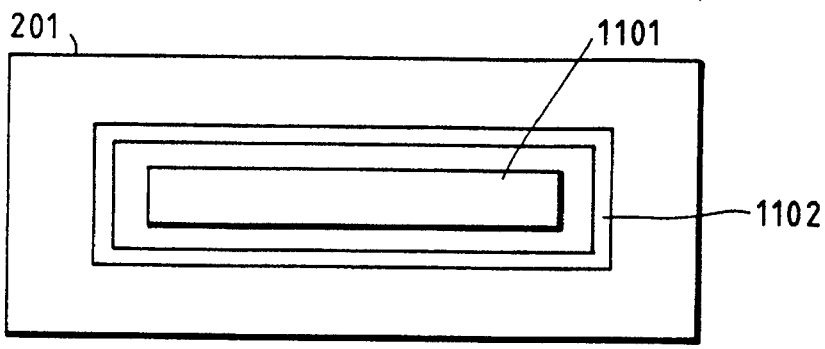
FIG. 17 shows a modification in the configuration of the semiconductor integrated circuit device according to the second embodiment, in which (a) is a plan view of a principal portion of a semiconductor chip and (b) is a sectional view thereof.
Figure 17B:
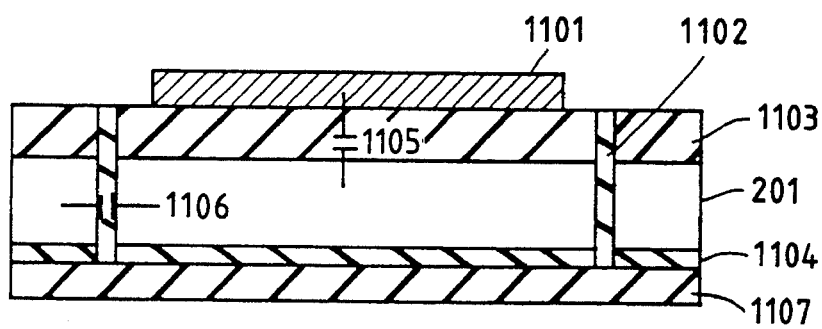

FIG. 17 shows an example in which a resistor is surrounded with a U-trench to decrease its capacity to substrate. In the same figure, (a) is a plan view of a principal portion of a semiconductor chip 201 and (b) is a sectional view thereof.

The numeral 1101 denotes a resistor formed on a main surface of the semiconductor chip 201, using polycrystal silicon for example, numerals 1103 and 1104 each denote a silicon oxide film; and numeral 1107 denotes an insulating substrate. In this example, the resistor 1101 is surrounded with a U-trench 1102, so that capacitors 1105 and 1106 are connected in series, whereby the capacity to substrate of the resistor 1101 can be decreased.

Figure 18:
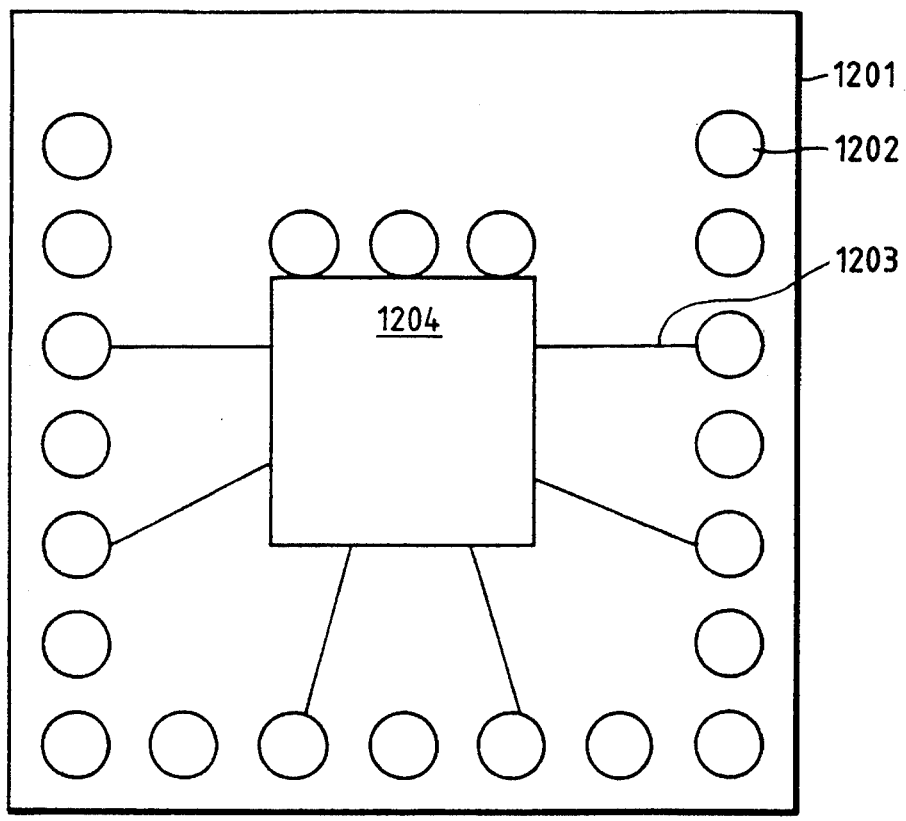
FIG. 18 is a schematic plan view of a semiconductor chip, showing a further modification in the configuration of the semiconductor integrated circuit device according to the second embodiment.

FIG. 18 shows an example in which active elements formed on a semiconductor chip 1201 are concentrated within a central area 1204 of the chip to thereby shorten the length of wiring connecting between circuits. In this example, since the distance from the area 1204 to each electrode pad 1202 is long, both are interconnected through a coplanar line 1203.

Thus in the case where active elements are concentrated within the central area 1204 of the chip, the heat radiation from the chip 1201 comes into question. However, by adopting the same face-down bonding method as in the foregoing embodiment 1, the heat of the chip can be allowed to escape to the package substrate side through the bump electrodes.

Figure 19:
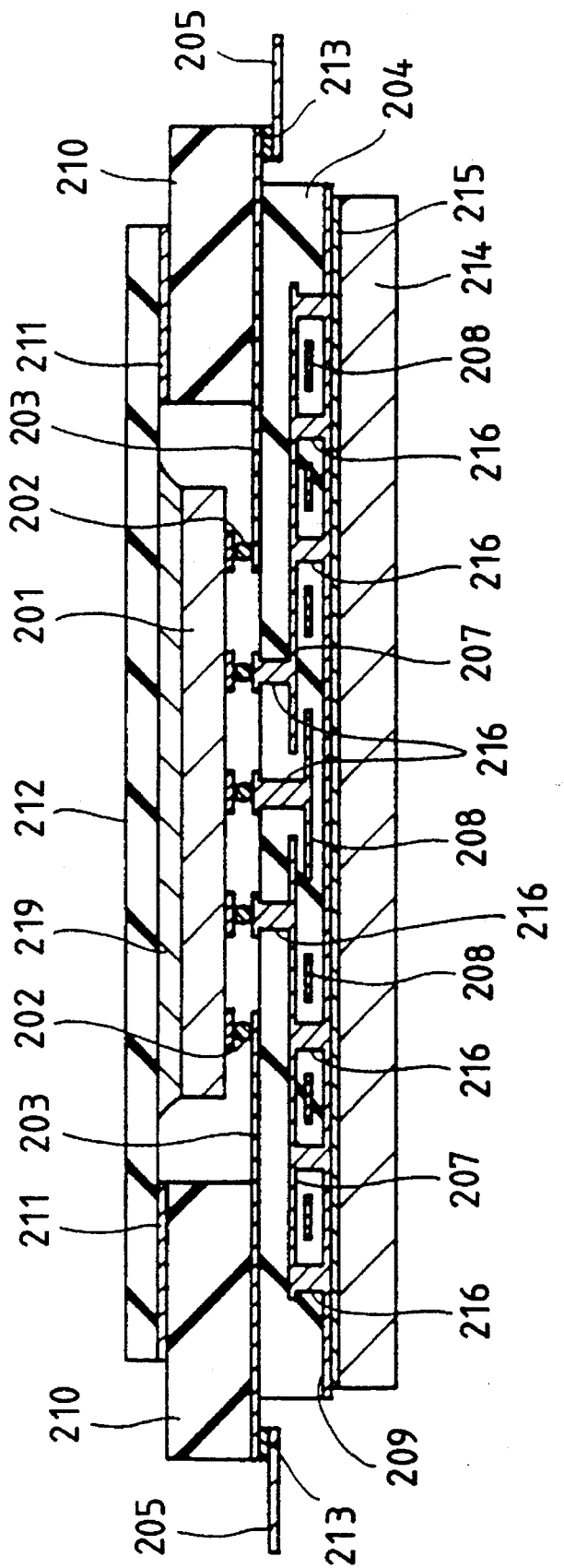
FIG. 19 is a sectional view showing a further modification in the configuration of the semiconductor integrated circuit device according to the second embodiment.

FIG. 19 shows an example in which the back of a semiconductor chip 201 and a metallic cap 212 are bonded together through a solder material 219. According to this construction, the heat of the chip 201 can be allowed to escape not only to a package substrate 204 side through bump electrodes 202 but also to the cap 212 side, so that the thermal resistance of the package can be further decreased.

Effects obtained by typical inventions out of those disclosed herein will be described below briefly.

By extending one ends of transmission lines formed on the package substrate up to positions just under the pads of a semiconductor chip and by bonding outer leads to the opposite ends of the transmission lines, it is made possible to provide good the transmission characteristics from the outer leads through the transmission lines on the package substrate up to the pads of the chip. Consequently, it is possible to provide a very high-speed LSI package having a good characteristic impedance matching throughout the whole of transmission lines in the package.

What is claimed is:

1. A mounting structure for a semiconductor integrated device comprising:
   a first substrate having:
      a first substantially flat surface and a second substantially flat surface opposite said first substantially flat surface;
      a central cavity formed in said first substantially flat surface toward said second substantially flat surface;
      first signal transmission lines formed on said first substantially flat surface, each of said first signal transmission lines having a first end portion which is adjacent to said cavity;
   an electronic package having:
      a second substrate having a third substantially flat surface;
      second signal transmission lines formed on said third substantially flat surface, each of said second signal transmission lines having a first end portion and a second end portion;
      a semiconductor chip having a main surface, said semiconductor chip including electrode pads on said main surface thereof, said semiconductor chip being mounted on said second substrate with said main surface of said semiconductor chip opposed to said third substantially flat surface of said second substrate, said first end portions of said second signal transmission lines being electrically connected to said electrode pads through bump electrodes; and
      leads bonded to a peripheral portion of said second substrate and protruding from said second substrate, said leads being electrically connected to said second end portions of said second signal transmission lines and extending substantially parallel to said second signal transmission lines;
   wherein at least one of said first end portions of said second signal transmission lines extends under said electrode pads located in a central area of said semiconductor chip and is electrically connected to one of said electrode pads, wherein said electronic package is mounted in said cavity of said first substrate, and wherein each of said leads of said electronic package is electrically connected to said first end portion of each of said first transmission lines and extends substantially parallel to said first transmission lines.

2. A mounting structure according to claim 1, further comprising earth conductors formed on said third substantially flat surface of said second substrate, wherein said earth conductors are formed between said second signal transmission lines.

3. A mounting structure according to claim 1, wherein said semiconductor chip includes a clock input buffer circuit formed on said central area of said main surface thereof, and wherein said clock input buffer is electrically coupled to said one of said electrode pads.

4. A mounting structure according to claim 3, wherein said semiconductor chip includes an input signal terminating resistor and a capacitor element coupled to one end of said input signal terminating resistor, formed on said main surface thereof, and wherein the other end of said input signal terminating resistor is electrically coupled to said clock input buffer circuit.

5. A mounting structure according to claim 1, wherein said second substrate includes a first insulating layer, a second insulating layer formed on said first insulating layer and a third insulating layer formed on said second insulating layer, wherein a first earth conductor plate is formed between said second and third insulating layers, a power source plate is formed between said first and second insulating layers, and second earth conductor plate is formed on a back surface of said first insulating layer, and wherein said first and second earth conductor plates are electrically connected to each other via through hole formed in said first and second insulating layers, and an upper surface of said third insulating layer corresponding to said third substantially flat surface of said second substrate.

6. A mounting structure for a semiconductor integrated circuit device comprising:

a first substantially flat surface and a second substantially flat surface opposite to said first substantially flat surface;

a cavity formed to cave from said first substantially flat surface toward said second substantially flat surface;

first signal transmission lines formed on said first substantially flat surface, each of said first signal transmission lines having a first end portion which is adjacent to said cavity;

an electronic package having:

a substrate having a third substantially flat surface;

second signal transmission lines formed on said third substantially flat surface, each of said second signal transmission lines having a first end portion and a second end portion;

a semiconductor chip having a main surface, said semiconductor chip including electrode pads on said main surface thereof, said semiconductor chip being mounted on said substrate in such a manner that said main surface of said semiconductor chip is opposed to said third substantially flat surface of said substrate, said first end portions of said second signal transmission lines being electrically connected with said electrode pads through bump electrodes;

a cap member formed over said substrate so as to cover said semiconductor chip; and leads protruding from a peripheral portion of said substrate, said leads being electrically connected with said second end portions of said second signal transmission lines and extending substantially parallel to said second signal transmission lines, wherein said electronic package is mounted in said cavity of said mounting substrate, and wherein each of said leads of said electronic package is electrically connected with said first end portion of each of said first signal transmission lines and extends substantially parallel to said first signal transmission lines.

7. A mounting structure according to claim 6 wherein a rear surface of said semiconductor chip and said cap member are bonded to each other by a solder material.

* * * * *